United States Patent
Yen et al.

(10) Patent No.: US 12,419,089 B2
(45) Date of Patent: Sep. 16, 2025

(54) SILICON CARBIDE SEMICONDUCTOR DEVICE

(71) Applicant: Fast SiC Semiconductor Incorporated, Hsinchu (TW)

(72) Inventors: Cheng-Tyng Yen, Hsinchu (TW); Hsiang-Ting Hung, Hsinchu (TW); Fu-Jen Hsu, Hsinchu (TW)

(73) Assignee: FAST SIC SEMICONDUCTOR INCORPORATED, Hsinchu (TW)

( * ) Notice: Subject to any disclaimer, the term of this patent is extended or adjusted under 35 U.S.C. 154(b) by 432 days.

(21) Appl. No.: 18/155,520

(22) Filed: Jan. 17, 2023

(65) Prior Publication Data

US 2023/0387215 A1  Nov. 30, 2023

Related U.S. Application Data

(60) Provisional application No. 63/346,325, filed on May 27, 2022.

(51) Int. Cl.
| | | |
|---|---|---|
| *H10D 62/832* | (2025.01) | |
| *H10D 12/01* | (2025.01) | |
| *H10D 30/66* | (2025.01) | |
| *H10D 62/10* | (2025.01) | |

(52) U.S. Cl.
CPC ....... *H10D 62/8325* (2025.01); *H10D 12/031* (2025.01); *H10D 30/668* (2025.01); *H10D 62/105* (2025.01)

(58) Field of Classification Search
CPC .. H10D 12/031; H10D 30/668; H10D 62/105; H10D 62/8325
USPC .......................................................... 257/77
See application file for complete search history.

(56) References Cited

U.S. PATENT DOCUMENTS

| | | | |
|---|---|---|---|
| 5,506,421 A | 4/1996 | Palmour | |
| 10,121,862 B2 | 11/2018 | Kurokawa et al. | |
| 10,700,192 B2 | 6/2020 | Siemieniec et al. | |
| 11,251,296 B2 | 2/2022 | Saggio et al. | |
| 2019/0348524 A1* | 11/2019 | Ebiike | H10D 62/154 |
| 2020/0194554 A1* | 6/2020 | Adachi | H10D 62/307 |
| 2021/0043736 A1* | 2/2021 | Yen | H10D 62/127 |

* cited by examiner

*Primary Examiner* — Igwe U Anya
(74) *Attorney, Agent, or Firm* — MUNCY, GEISSLER, OLDS & LOWE, P.C.

(57) ABSTRACT

A silicon carbide semiconductor device includes a drift layer, a first doped region, a second doped region, a gate trench, a third doped region and a gate electrode. The drift layer is disposed on a SiC substrate. The first doped region is disposed on the drift layer. The second doped region is disposed on the first doped region. The gate trench is extended from an upper surface of the second doped region through the first doped region and into the drift layer. The gate trench is formed in a manner dividing the drift layer into a plurality of mesas encircled by the gate trench, each of the mesas comprises a center portion and a plurality of leg portions extended from the center portion. The third doped region is arranged in the center portion of the mesa, and is disposed in the first doped region and adjacent to the second doped region. The gate electrode is arranged in the gate trench and dielectrically insulated from the first doped region, the second doped region and the drift layer by a gate insulator.

15 Claims, 14 Drawing Sheets

SILICON CARBIDE SEMICONDUCTOR DEVICE

CROSS REFERENCE TO RELATED APPLICATIONS

This application claims priority of U.S. Provisional Application No. 63/346,325 filed on May 27, 2022 under 35 U.S.C. § 119(e), the entire contents of all of which are hereby incorporated by reference.

FIELD OF THE INVENTION

The disclosure relates to a semiconductor device and more particularly to a silicon carbide semiconductor device.

BACKGROUND OF THE INVENTION

Silicon carbide (SiC) as an emerging semiconductor material for power devices provides superior properties including high dielectric strength to the electric field and low intrinsic carrier concentration over conventional silicon (Si) power devices due to its wide band gap.

Power transistors, such as Power MOSFETs (metal-oxide-semiconductor field effect transistors) and IGBTs (insulated gate bipolar transistors) are usually vertical devices where the gate and source (or emitter) terminals are disposed on the top surface of the transistors and the drain (or collector) terminals are disposed on the bottom surface of the transistors. Power transistors can be further classified into trench gate type or planar gate type, depending on the implemented gate structure. The benefit of trench gate type transistor is that it possesses a potential to increase the channel width density compared to planar gate type transistor, but this comes with the drawback that the gate insulator may experience a higher electric field compared to planar gate type transistor. This problem is particularly severe for SiC power transistors with trench gate because the dielectric strength of SiC is on the same order of gate insulators. To address this problem, additional structures, such as p+ protecting regions around the trench bottom, are often used in SiC trench gate type power transistors to protect the gate insulator which limits the channel width density. These protecting regions have to be properly grounded to the source terminal, to avoid the abnormal effects caused by charging/discharging of these regions. In addition to these protecting structures, the source contacts used to connect the source (or emitter) region and the body region (or base region) also limit the achievable channel width density of SiC trench gate type power transistors.

SUMMARY OF THE INVENTION

A silicon carbide semiconductor device according to an embodiment of the present invention comprises: a drift layer, disposed on a SiC substrate, the drift layer having a first conductivity type; a first doped region having a second conductivity type, disposed on the drift layer; a second doped region having the first conductivity type, disposed on the first doped region; a gate trench extending from an upper surface of the second doped region through the first doped region and into the drift layer, the gate trench is formed in a manner dividing the drift layer into a plurality of mesas encircled by the gate trench, each of the mesas comprising a center portion and a plurality of leg portions extended from the center portion; a third doped region having the second conductivity type arranged in the center portion of the mesa, disposed in the first doped region and adjacent to the second doped region; and a gate electrode arranged in the gate trench and dielectrically insulated from the first doped region, the second doped region and the drift layer by a gate insulator.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF THE PREFERRED EMBODIMENTS

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In the drawings, the thickness of layers and regions are exaggerated for clarity. It will also be understood that when an element such as a layer, portion, region, or substrate is referred to as being "on", "overlie" or "atop" another element, it can be directly on, directly overlie or directly atop the other element or intervening elements may also be present. In contrast, when an element is referred to as being "directly on", "directly overlie" or "directly atop" another element, there are no intervening elements present.

Relative terms such as "below", "above", "upper", "lower", "horizontal", or "vertical" may be used herein to describe a relationship of one element, layer, portion, or region to another element, layer, portion, or region as illustrated in the figures. It will be understood that these terms and those discussed above are intended to encompass different orientations of the device in addition to the orientation depicted in the figures. A number of embodiments will be explained below, identical structural features are identified by identical or similar reference symbols in the figures. As used herein, "lateral" or "lateral direction" should be understood to mean a direction or extent that runs generally parallel to the lateral extent of the semiconductor device. The lateral direction thus extends generally parallel to its surfaces or sides. In contrast thereto, the term "thickness direction" is understood to mean a direction that runs generally perpendicular to its surfaces or sides and thus to the lateral direction.

The terminology used herein is for the purpose of describing particular embodiments only and is not intended to be limiting of the disclosure. As used herein, the singular forms "a", "an", and "the" are intended to include the plural forms as well, unless the context clearly indicates otherwise. It will be further understood that the terms "comprises", "comprising", "includes", and/or "including" when used herein specify the presence of stated features, elements, and/or components, but do not preclude the presence or addition of one or more other features, elements, components, and/or groups thereof. The indefinite articles and the definite articles shall encompass both the plural and singular unless the opposite is clearly apparent from the context.

The terms "first conductivity type" and "second conductivity type" refer to opposite conductivity types such as N-type or P-type, however, each embodiment described and illustrated herein includes its complementary embodiment as well. Like numbers refer to like elements throughout.

Figure 1A:
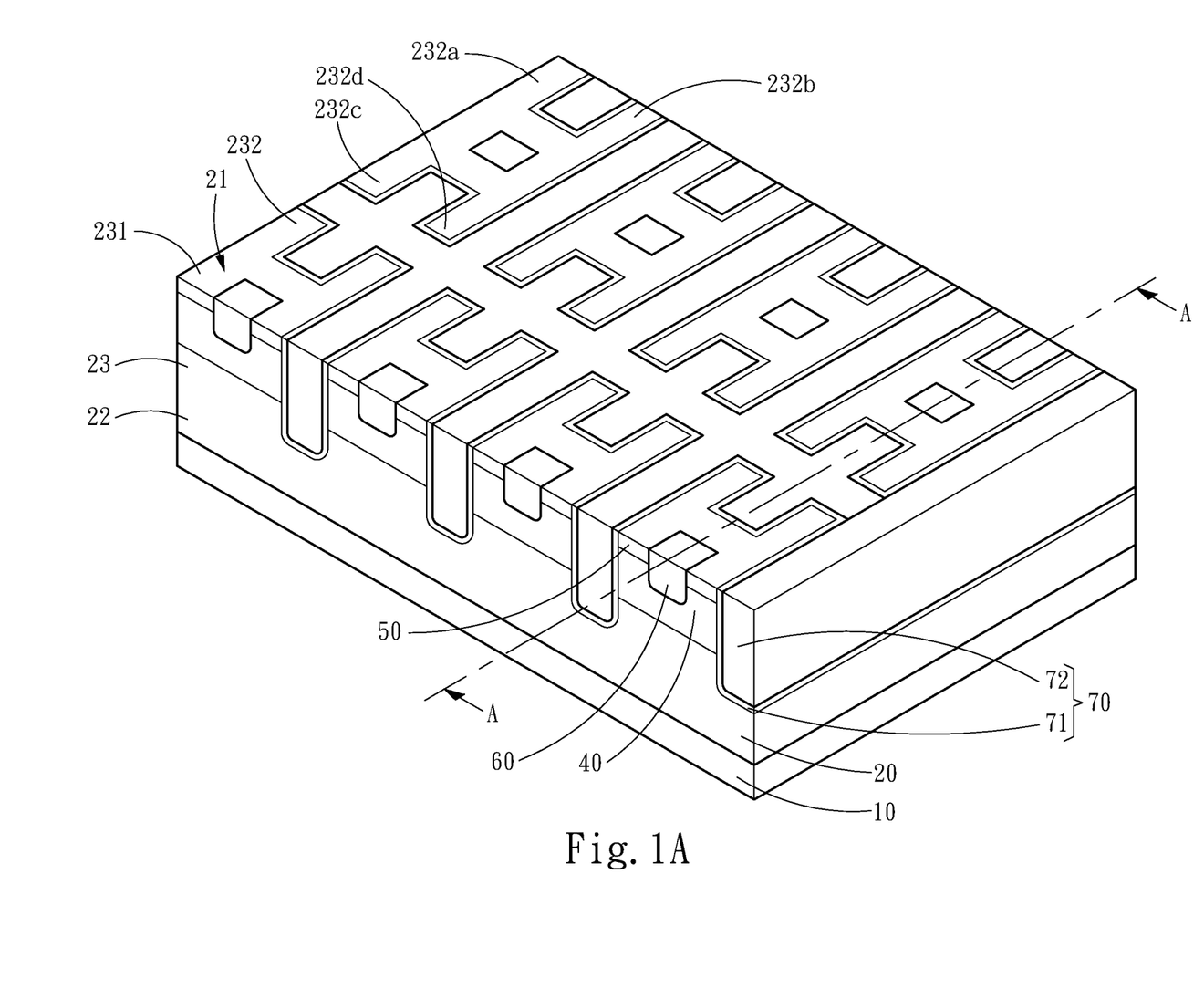
FIG. 1A shows perspective view of a silicon carbide semiconductor device in accordance with a first embodiment of the present disclosure.
Figure 1B:
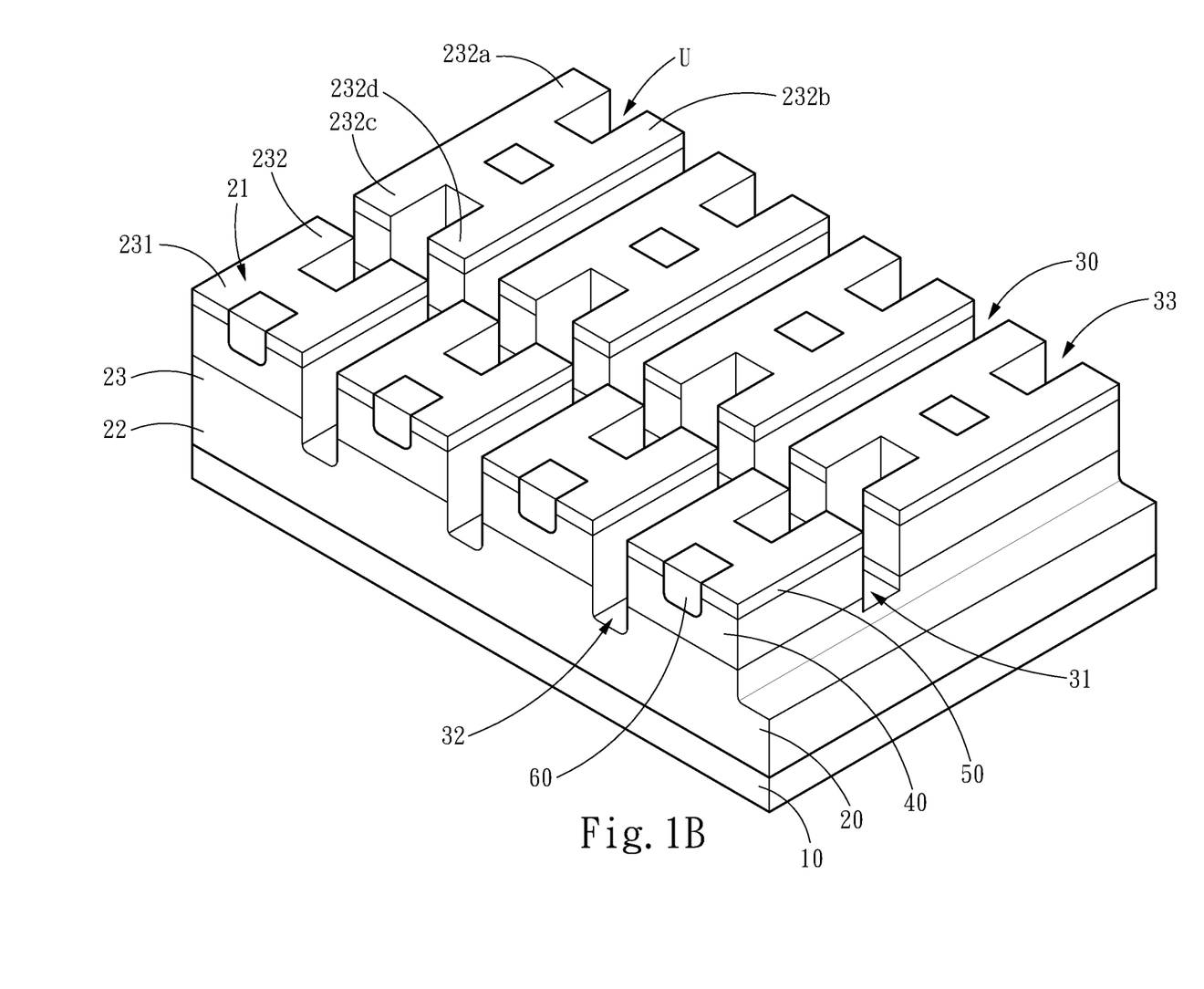
FIG. 1B shows perspective view of a silicon carbide semiconductor device without showing the gate structure, in accordance with the first embodiment of the present disclosure.
Figure 1C:
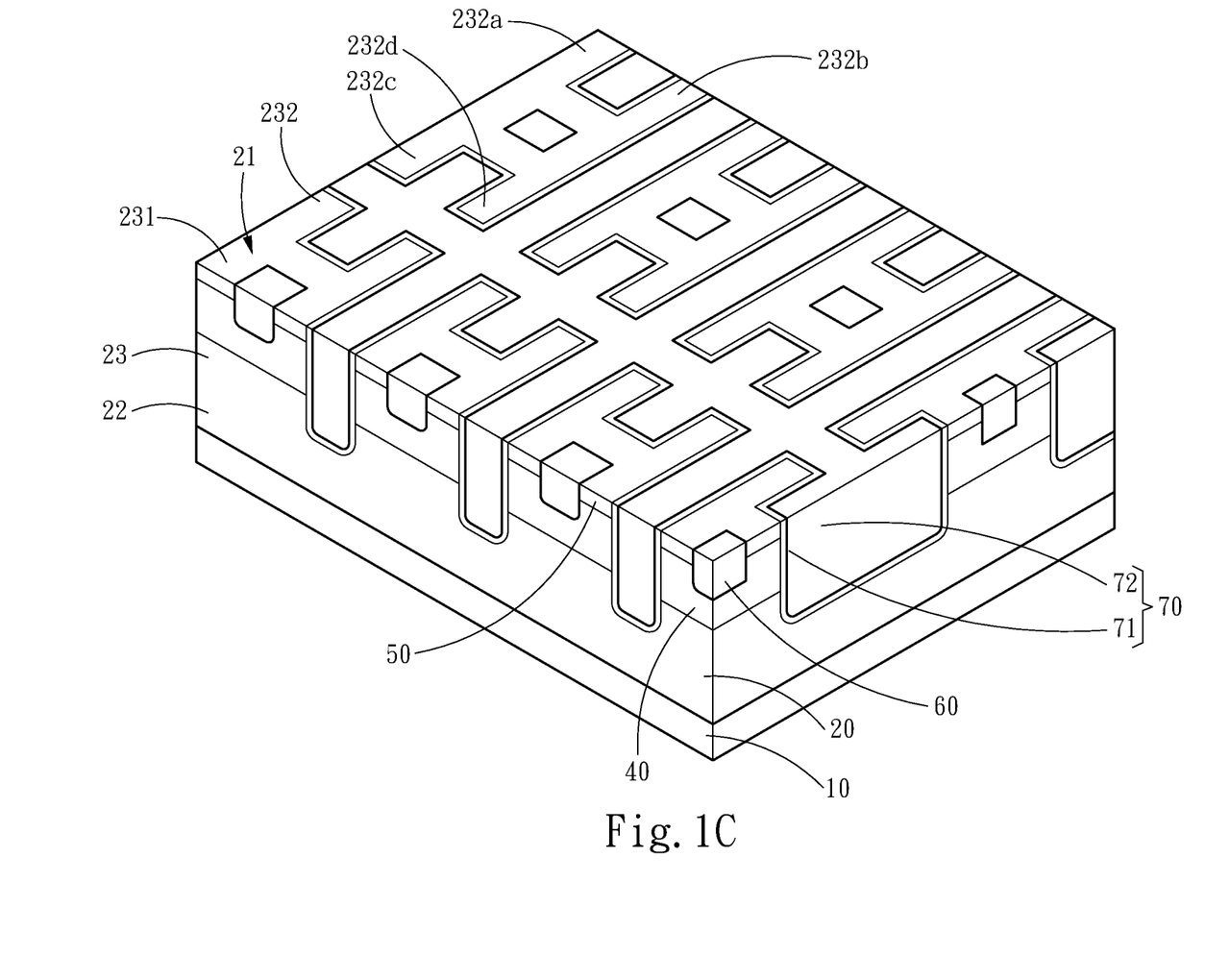
FIG. 1C shows perspective view of a silicon carbide semiconductor device taken along section A-A in FIG. 1A, in accordance with the first embodiment of the present disclosure.

FIGS. 1A to 1C illustrate a silicon carbide semiconductor device in accordance with a first embodiment of the present disclosure. The silicon carbide semiconductor device comprises a SiC substrate 10, a drift layer 20, a gate trenches 30, a first doped region 40, a second doped region 50, a third doped region 60 and a gate structure 70.

The SiC substrate 10 has a first conductivity type (e.g., N-type), for example a nitrogen doped 4H-SiC substrate. The drift layer 20 is disposed on the substrate 10 and has the first conductivity type. The first doped region 40 may be disposed on the drift layer 20 and adjoining a front surface 21 of the drift layer 20. The first doped region 40 has a second conductivity type (e.g., P-type), which is opposite to the first conductivity type. The first doped region 40 may be formed by epitaxial processes, for example, by continuously growing a P-type layer directly on a N-type drift layer in a MOCVD reactor or by implantation processes by implanting aluminum ions as dopants into the N-type drift layer to form a counter-doped P-type region adjoining to a front surface of the drift layer 20. The second doped region 50 is disposed on the first doped region 40. The second doped region 50 has the first conductivity type. Similar to the first doped region 40, the second doped region 50 may also be formed by epitaxial processes or by ion-implantation processes. The third doped region 60 of the first conductivity type is disposed in the first doped region 40 and adjacent to the second doped region 50. In an example, the drift layer 20 is N-type and has a thickness of 10 μm and a doping concentration of $8E15$ $cm^{-3}$; the first doped region 40 is P-type and has a thickness of 1 μm and a doping concentration of $1E17$ $cm^{-3}$; the second doped region is N-type and has a thickness of 0.3 μm and a doping concentration of $1E20$ $cm^{-3}$.

The gate trench 30 is introduced from the front surface 21 of the drift layer 20 extending right into the drift layer 20 along a thickness direction. The gate trench 30 has a bottom deeper than a bottom of the first doped region 40. When viewed along a normal to the front surface 21 of the drift layer 20, the gate trench 30 may be arranged in gate rows extending along a first horizontal direction and also in gate columns along a second horizontal direction, wherein the gate trench alternate sequentially. In detail, the gate trench 30 may comprise a plurality of first trenches 31 and a plurality of second trenches 32 which may be stripe-shaped and run along the first and second horizontal directions, respectively. As shown, the first trenches 31 and the second trenches 32 may be spaced apart from each other in the first horizontal direction and the second horizontal direction, respectively.

The gate structure 70 is formed in the gate trench 30. The gate structure 70 comprises a gate insulating layer 71 and a gate 72. The gate insulating layer 71 is formed on a sidewall and a bottom wall of the gate trench 30 and the gate 72 is formed on the gate insulating layer 71. The gate insulating layer 71 may completely insulate the gate 72 from the drift layer 20. The gate insulating layer 71 may be implemented by $SiO_2$ or $SiO_xN_y$, and the gate 72 may be implemented by polysilicon (poly-Si).

By forming the gate trench 30, the drift layer 20 is divided into a bottom section 22 and a plurality of mesas 23 on the bottom section 22. Each of the mesas 23 is spaced apart from each other in the first and second horizontal directions. In the present embodiment, the gate trench 30 may further comprise a plurality of bulge trenches 33, where each of the mesas 23 comprises a center portion 231 and a plurality of leg portions 232 complementary to the bulge trenches 33. A first leg portion 232a and a second leg portion 232b are extended from each of two ends of a first side of the center portion 231 along the second horizontal direction, and a third leg portion 232c and a fourth leg portion 232d are extended from each of two ends of a second side of the center portion 231 along the second horizontal direction. Thus, the silicon carbide semiconductor device could be viewed as including a plurality of H-shaped multi-layered units U arranged spaced from each other. A contact, for example a source contact of MOSFET or an emitter contact may be formed on the center portion 231, allowing the second doped region 50 and the third doped region 60 electrically connecting to a source terminal of MOSFET or an emitter terminal of IGBT. By incorporating the leg portions, the total channel width of the device can be increased without violating the manufacturing design rules. Because the total channel width of each unit cell U of the device in accordance with the present invention is a perimeter of the mesa 23.

Taking a conventional stripe-type trench gate type MOSFET as an comparison example, following a certain design rule where a minimum trench width is 1 µm, a minimum contact width is 1 µm, a minimum spacing between the trench and the contact is 1 µm, the minimum cell pitch is 4 µm, and the channel width density will be 0.5 µm$^{-1}$ (the unit cell channel width 2*y µm divided by the unit cell area y*4 µm$^2$). In the present embodiment, if the length of the leg portion is 5 µm, and the area of the center portion is 3 µm*3 µm (following the design rule), then the channel density will be 0.68 µm$^{-1}$ (the unit cell channel width is 52 µm, divided by the unit cell area 4 µm*19 µm=76 µm$^2$), higher than the conventional stripe cells. In addition to that, the leg portions can be made very narrow to utilize the effects of FinFETs in order to further improve the performance.

Figure 2:
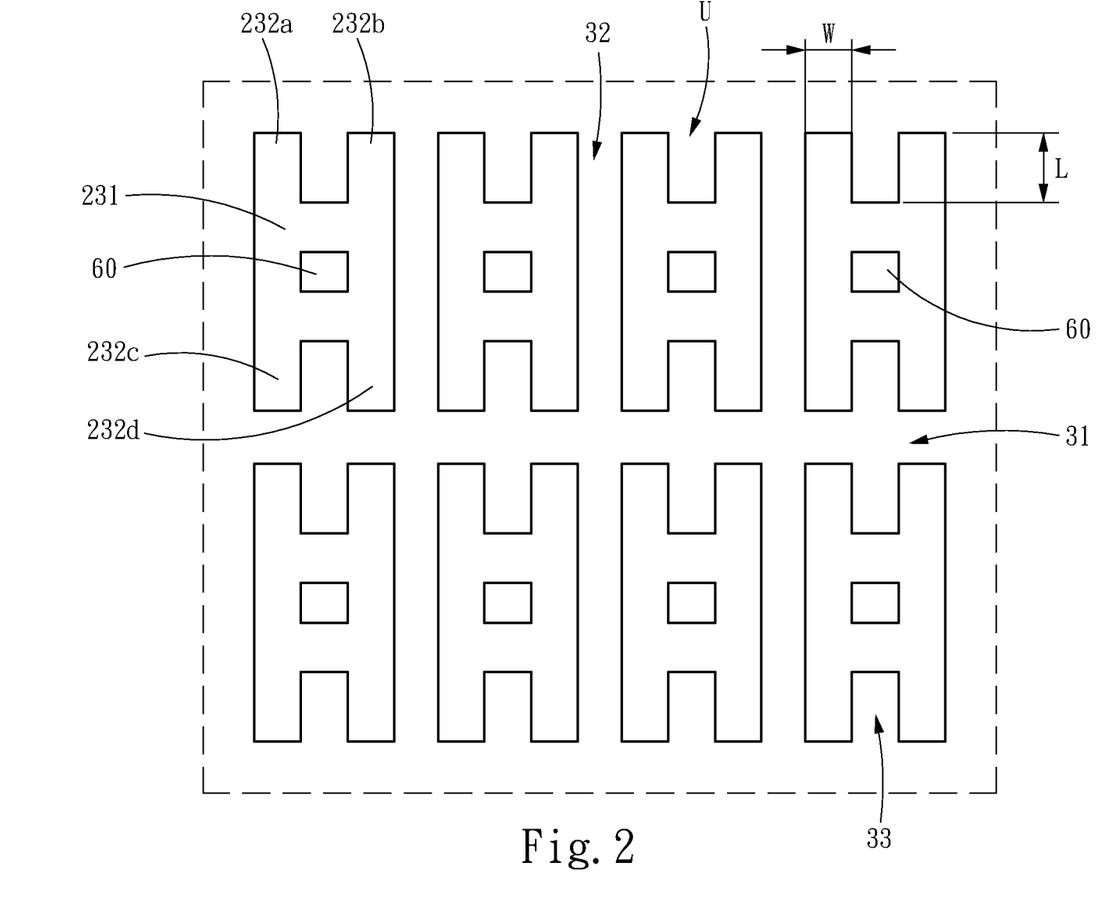
FIG. 2 is a top view of a portion of the silicon carbide semiconductor device in accordance with the first embodiment of the present disclosure.

FIG. 2 is a top view of a portion of the silicon carbide semiconductor device in accordance with the first embodiment of the present disclosure. In one embodiment, the leg portion may have a width W ranging from 10 nm to 5 µm and a length L (distance from the side of the center portion 231 to an end) ranging from 0.5 µm to 100 µm. Each of the leg portions may have same or different width W and length L. As shown in FIG. 2, the geometry of the center portion 231 is a square. In other embodiments, the center portion 231 may be of a, a rectangle, a circle, an octagon, an oval, or a diamond, or any other irregular shape. Similarly, the third doped region 60 may be of a square, a circle, a rectangle, an octagon, an oval, or a diamond, or any other irregular shape.

In the embodiments described and illustrated herein, the gate trench 30 may be equally spaced, may have equal width, and may form a regular stripe pattern, wherein a center-to-center distance between the gate trench 30 may be in a range from 0.5 lam to 60 µm. A vertical extension of the gate trench 30 may be in a range from 0.5 lam to 60 µm. At the bottom, the gate trench 30 may have rounded corners to mitigate the field-crowding effect.

The third doped region 60 has the second conductivity type arranged in the center portion 231 of the mesa 23, disposed in the first doped region 40 and adjacent to the second doped region 50. The third doped region 60 is for example P-type and has a thickness of 0.6 µm and a doping concentration of 1E19 cm$^{-3}$.

Figure 3A:
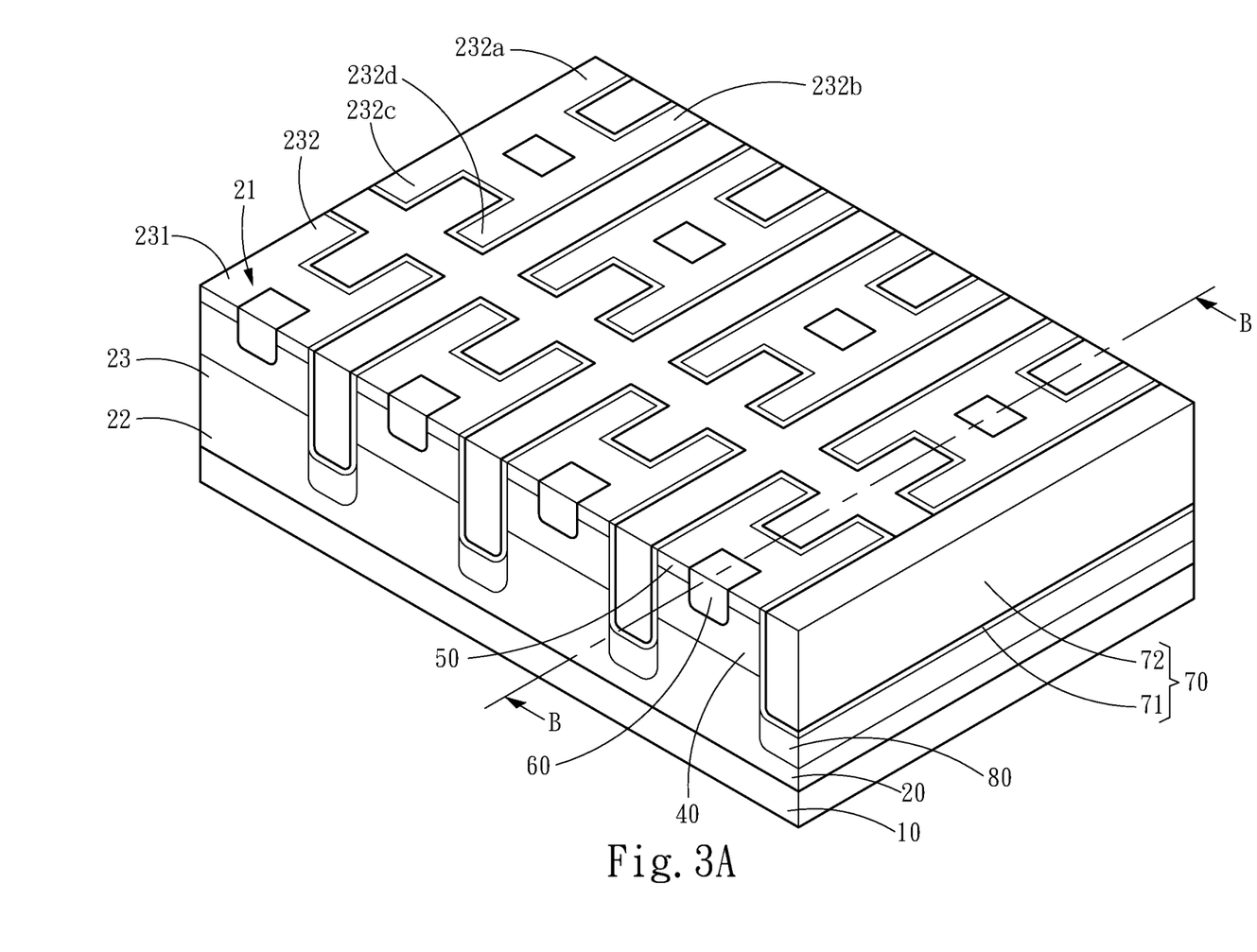
FIG. 3A shows perspective view of a silicon carbide semiconductor device in accordance with a second embodiment of the present disclosure.
Figure 3B:
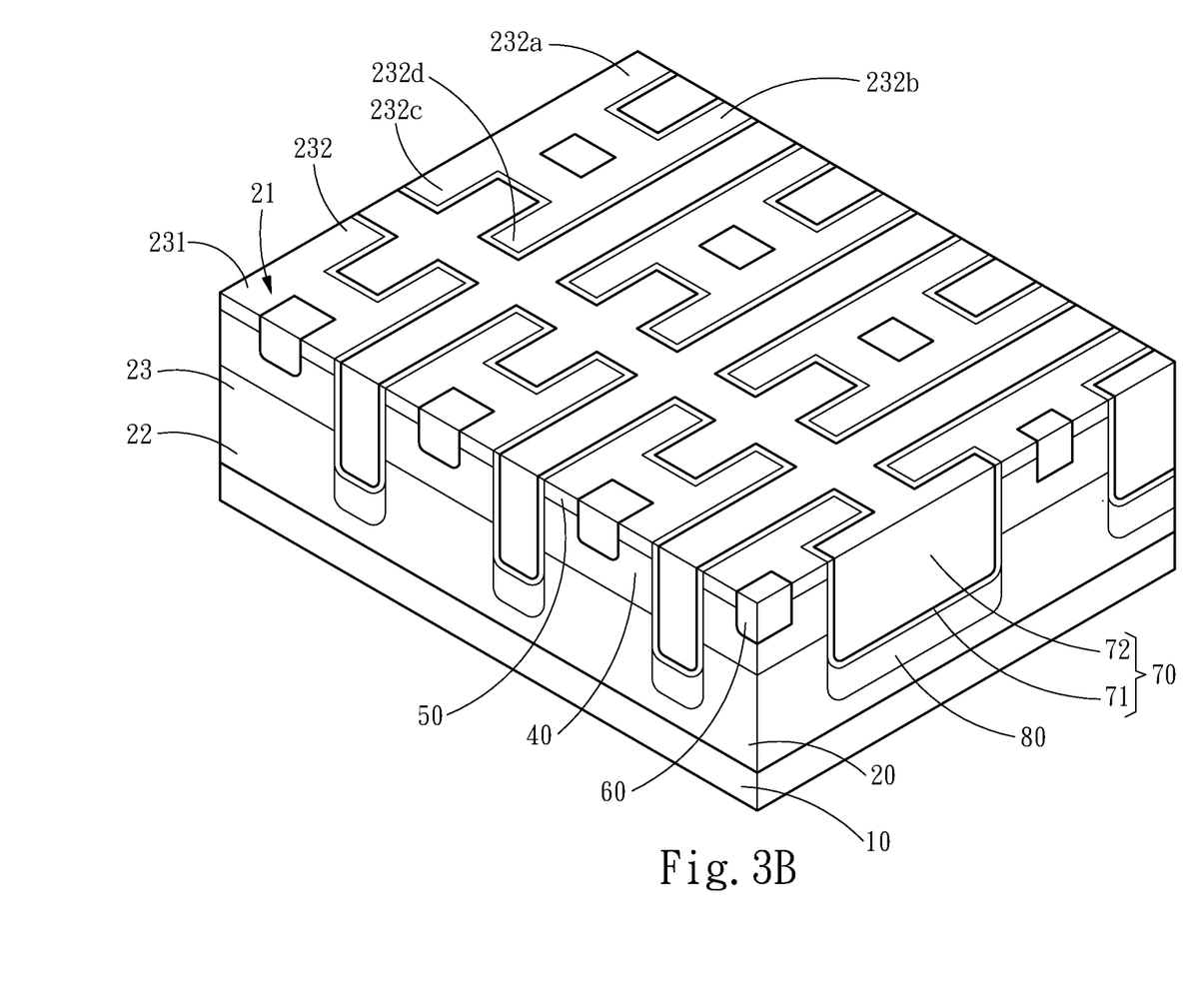
FIG. 3B shows perspective view of a silicon carbide semiconductor device taken along section B-B in FIG. 3A, in accordance with the second embodiment of the present disclosure.

FIGS. 3A to 3B illustrate a silicon carbide semiconductor device in accordance with a second embodiment of the present disclosure. The silicon carbide semiconductor device further comprises a protection region 80 formed underneath the gate trench 30 by ion implantation. The protection region 80 has the second conductivity type (e.g., p-type) and may adjoin at least a bottom of the gate trench 30. The protection region 80 is extended along the bottom of the gate trench 30. A vertical extension of the protection region 80 may be at least 0.1 µm.

Figure 4A:
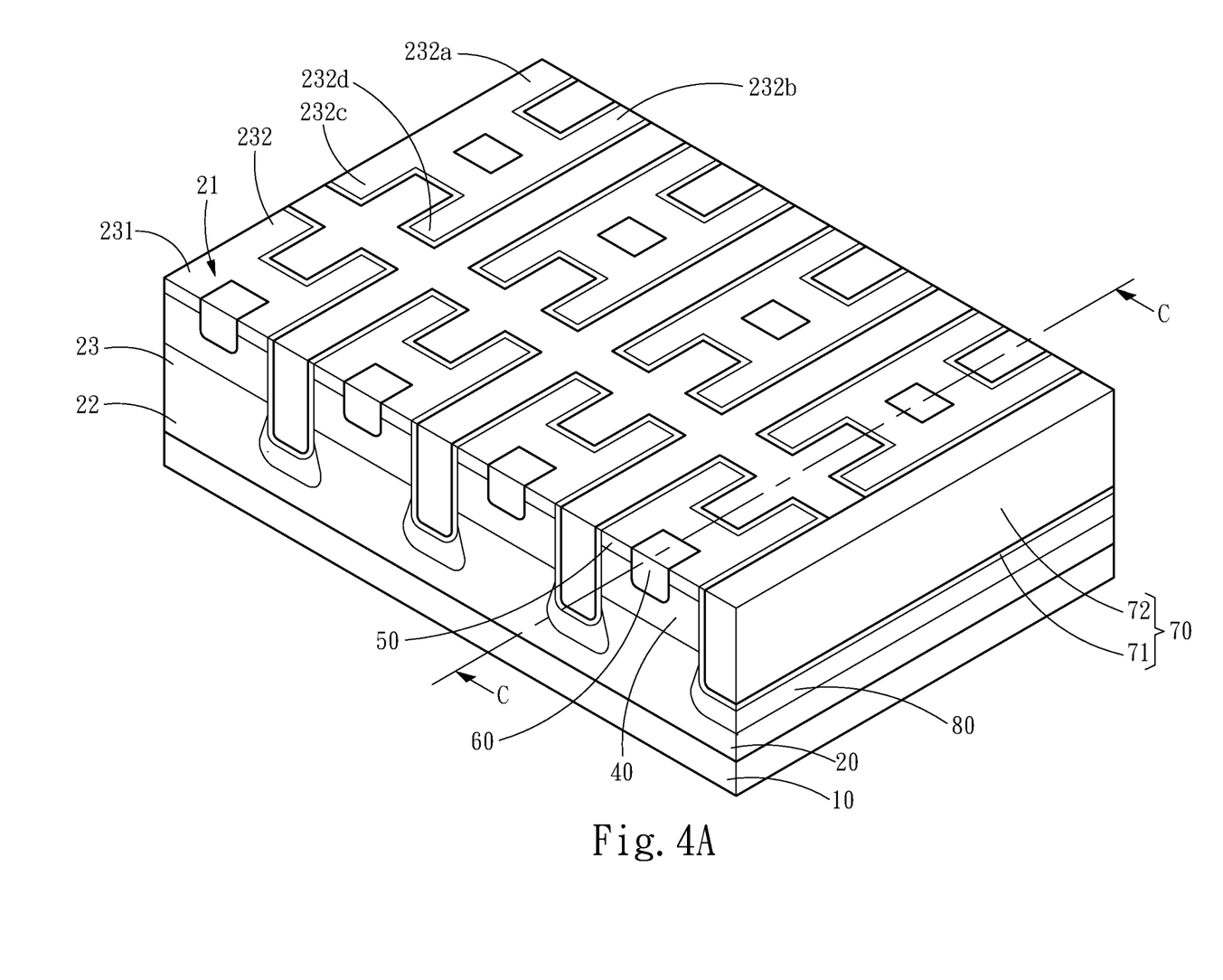
FIG. 4A shows perspective view of a silicon carbide semiconductor device in accordance with a third embodiment of the present disclosure.
Figure 4B:
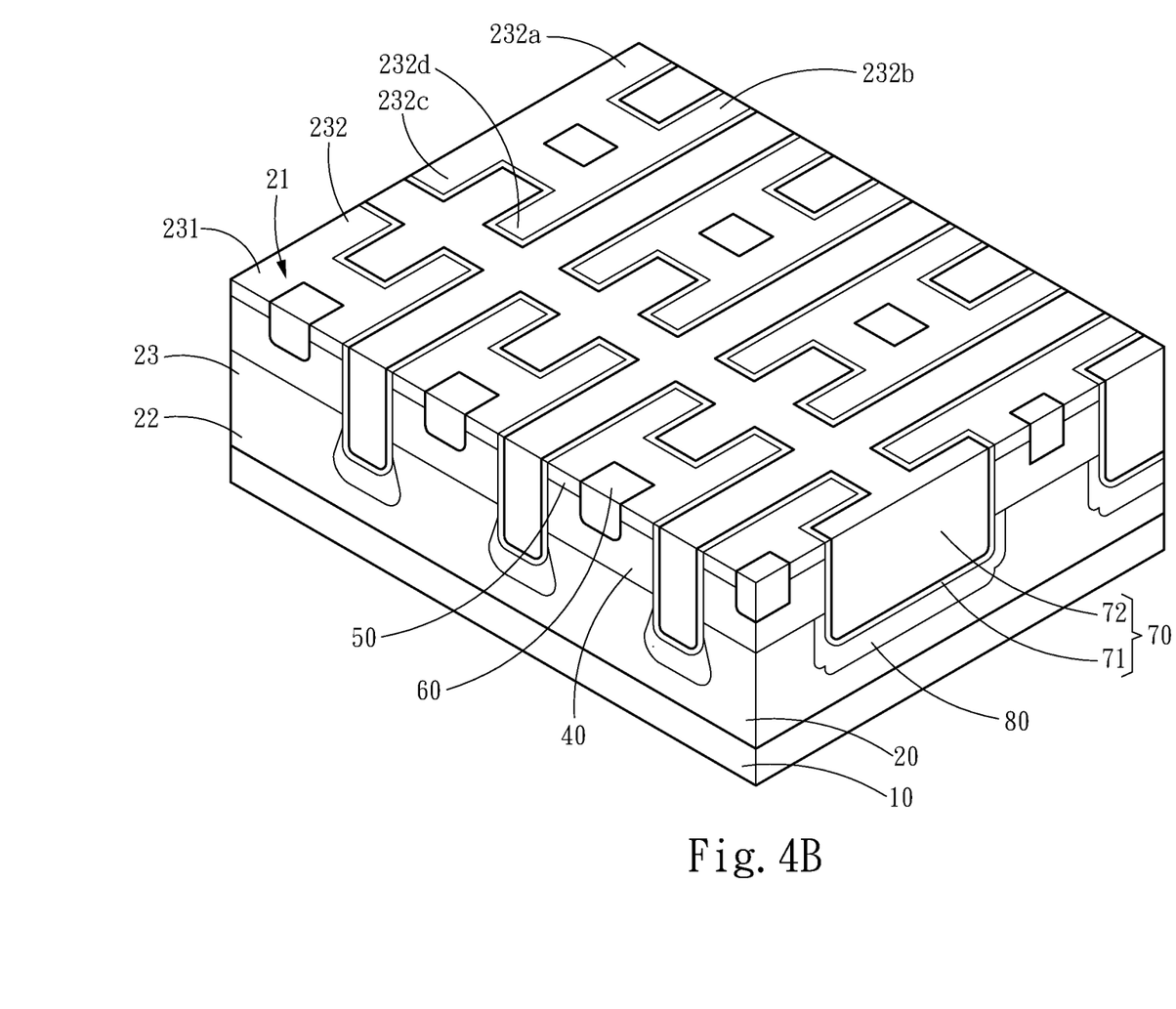
FIG. 4B shows perspective view of a silicon carbide semiconductor device taken along section C-C in FIG. 4A, in accordance with the third embodiment of the present disclosure.

Pursuant to still further embodiments of the present invention, the protection region 80 may extend along and adjoin the bottoms and the partial sidewalls of the gate trench 30, and contacting to the first doped region 40 along the tip end of the bugle trenches 33 as shown in FIGS. 4A to 4B. The protection region 80 may protect the gate structure 70 from high electric field strengths occurring during a reverse voltage applied to the device.

Figure 5A:
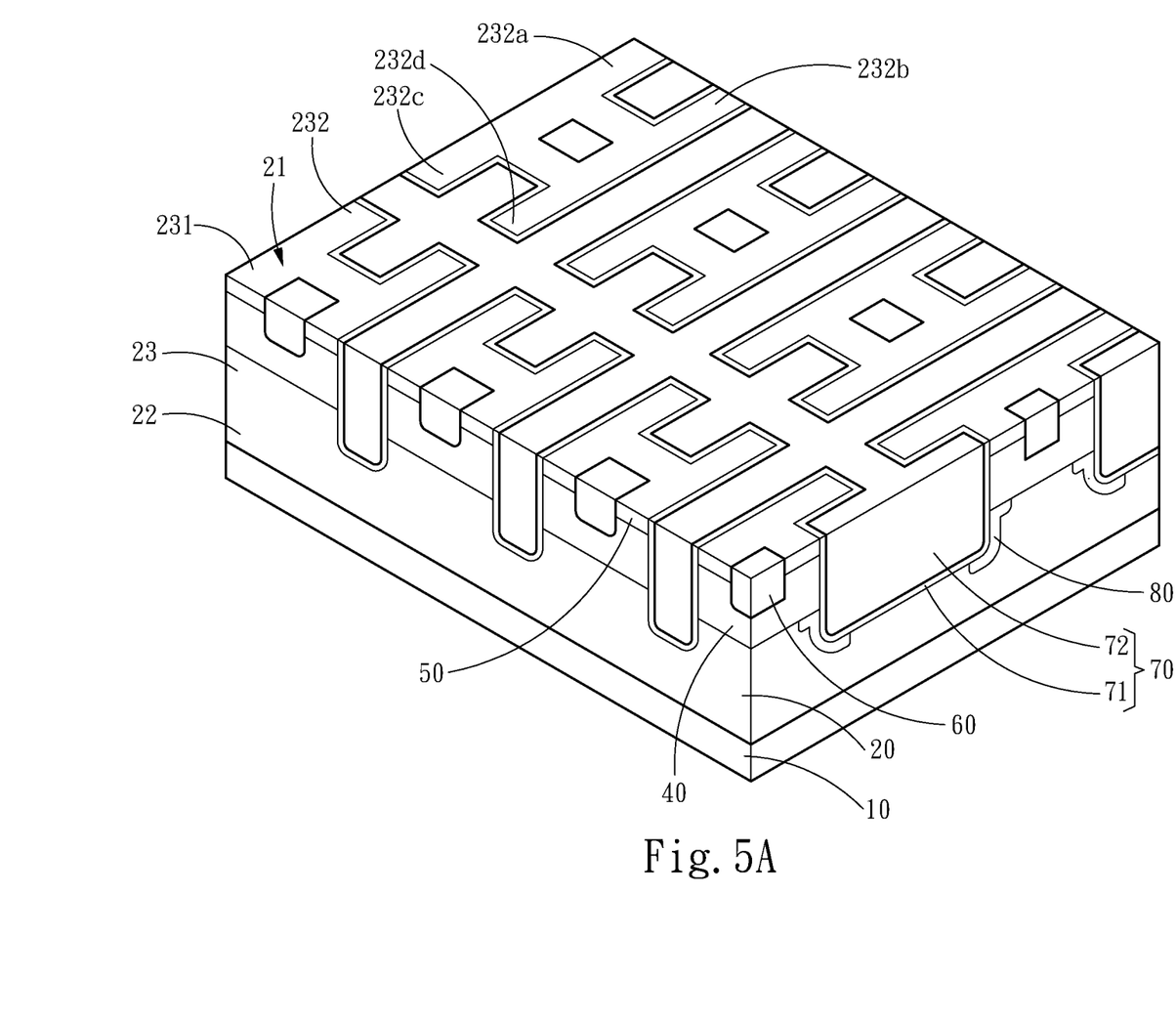
FIG. 5A shows perspective view of a silicon carbide semiconductor device in accordance with a fourth embodiment of the present disclosure.
Figure 5B:
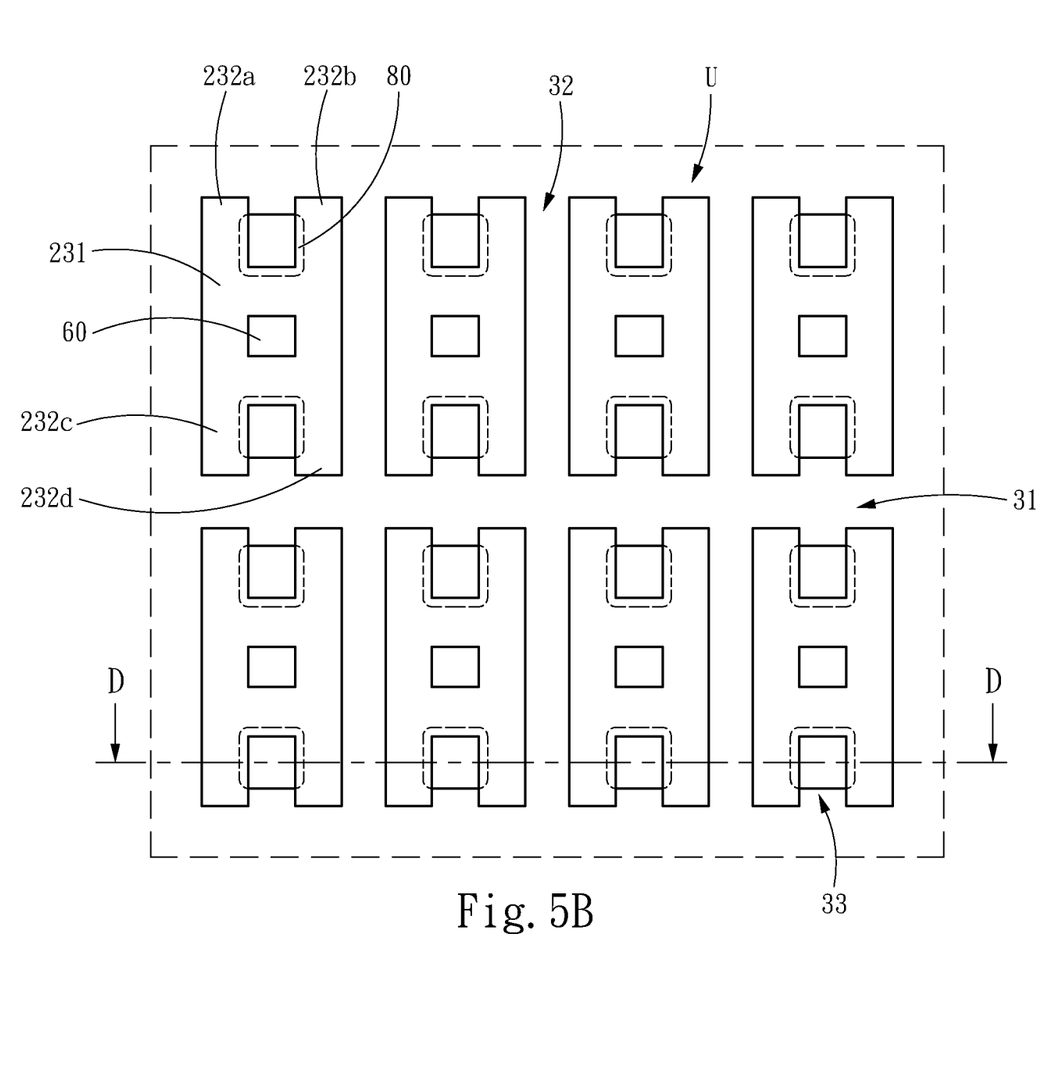
FIG. 5B is a top view of a portion of the silicon carbide semiconductor device in accordance with the fourth embodiment of the present disclosure.
Figure 5C:
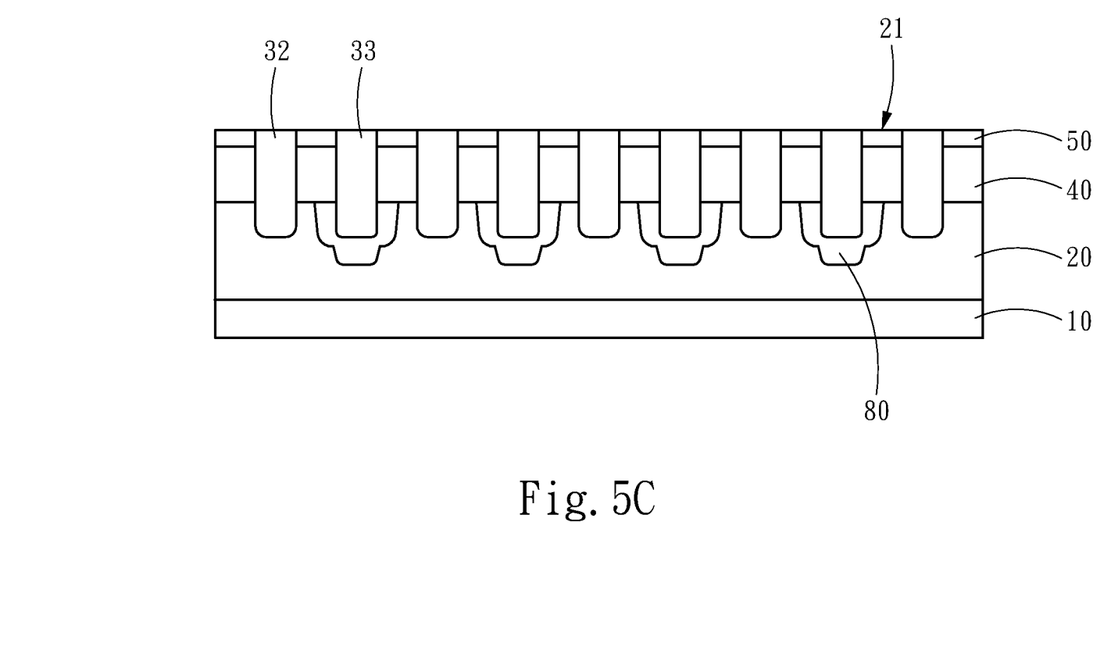
FIG. 5C is a cross-sectional view taken along the line D-D of FIG. 5B.

FIGS. 5A to 5C illustrate a silicon carbide semiconductor device in accordance with a third embodiment of the present disclosure. The protection region 80 may be formed only underneath the bugle trenches 33 and adjoin a partial bottom of each of the bugle trenches 33. In the present embodiment, the semiconductor device may comprise a plurality of separate protection regions. Each of the separate protection regions is extended along and adjoin the bottoms and the partial sidewalls of the bugle trenches 33 and contacting to the first doped region 40 along the tip end of the bulge trenches 33. A vertical extension of the protection region 80 may be at least 0.1 µm.

Figure 6:
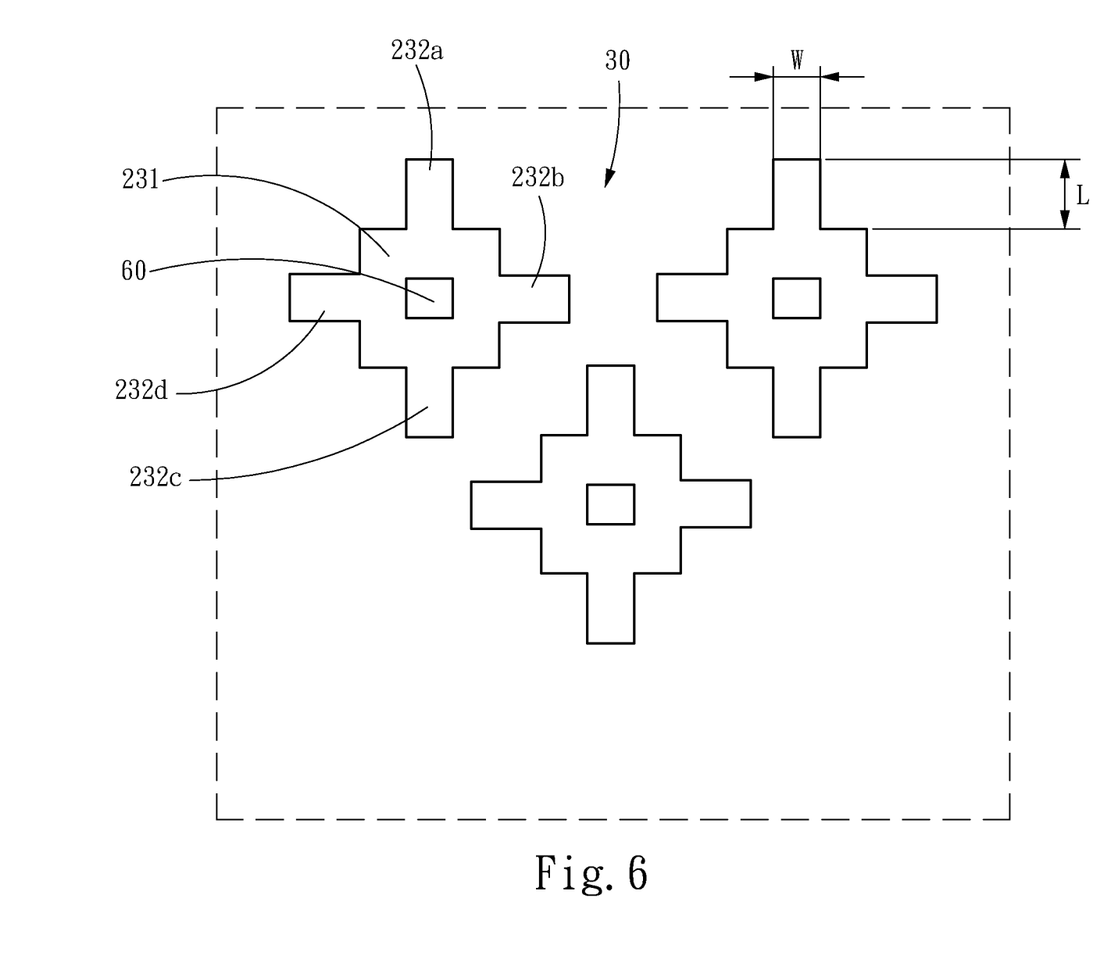
FIG. 6 is a top view of a portion of the silicon carbide semiconductor device in accordance with a fifth embodiment of the present disclosure.

In the present disclosure, the number of the leg portions may be different and the leg portions may be extended from different sides of the center portion 231 of the mesas 23 thus the multi-layered units U may also be configured in other geometries other than H-shape viewed from the thickness direction to meet various requirements. It may be perceived that a modified version of the multi-layered units U may be implemented as illustrated in FIG. 6. With reference to FIG. 6, as another embodiment, the leg portions include a first leg portion 232a, a second leg portion 232b, a third leg portion 232c and a fourth leg portion 232d, which are extended from a center of four sides of the center portion 231, respectively. Thus, the silicon carbide semiconductor device could be viewed as including a plurality of cross-shaped multi-layered units U arranged spaced from each other.

Figure 7:
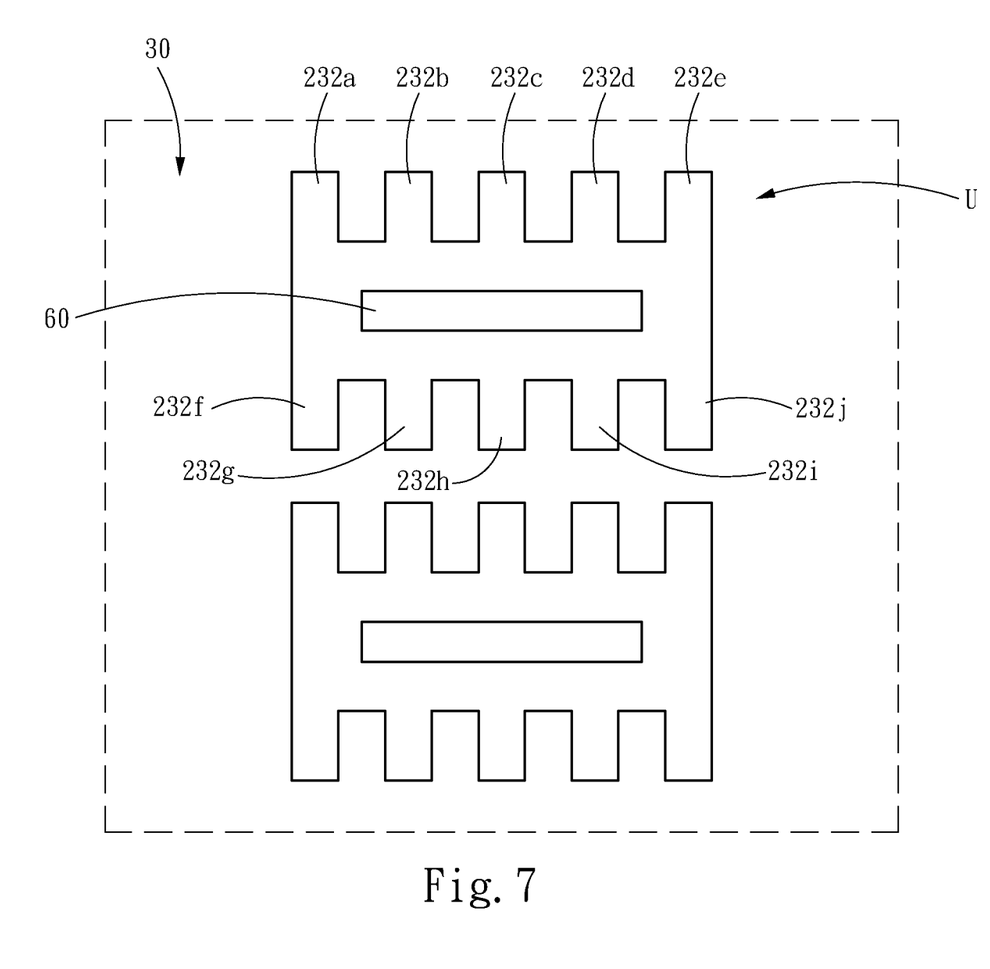
FIG. 7 is a top view of a portion of the silicon carbide semiconductor device in accordance with a sixth embodiment of the present disclosure.

With reference to FIG. 7, in an alternative embodiment, the leg portions may include a first leg portion 232a, a second leg portion 232b, a third leg portion 232c, a fourth leg portion 232d, a fifth leg portion 232e, a sixth leg portion 232f, a seventh leg portion 232g, an eighth leg portion 232h, a ninth leg portion 232i, and a tenth leg portion 232j. The first leg portion 232a, the second leg portion 232b, the third leg portion 232c, the fourth leg portion 232d and the fifth leg portion 232e are extended from a first side of the center portion 231 and spaced in an equal interval. The sixth leg portion 232f, the seventh leg portion 232g, the eighth leg portion 232h, the ninth leg portion 232i, and the tenth leg portion 232j are extended from a second side of the center portion 231 and spaced in an equal interval. Particularly, it is desirable that there is no limitation on the number of the leg portions.

Figure 8:
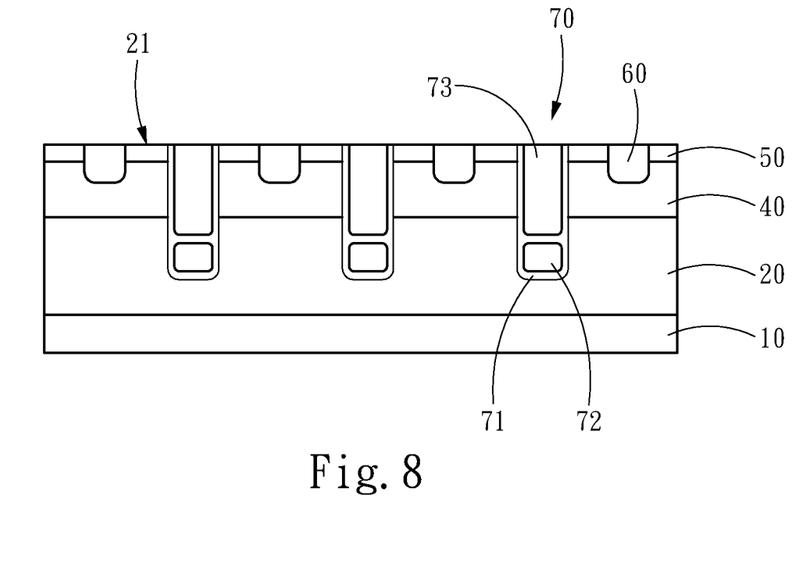
FIG. 8 is a cross-sectional view of the silicon carbide semiconductor device in accordance with a seventh embodiment of the present disclosure.

Referring now to FIG. 8, a cross-sectional view of the silicon carbide semiconductor device in accordance with a sixth embodiment of the present disclosure is illustrated. The gate structure 70 further comprises a so-called split gate structure, where the gate structure 70 comprise a controlling gate 73 and a shielding gate 72. The controlling gate 73 and the shielding gate 72 are isolated from each other by insulator. In one embodiment, the silicon carbide semiconductor device is a silicon carbide MOSFET comprising a gate electrode, a source electrode and a drain electrode, where the controlling gate 73 is arranged to electrically connect to the gate electrode and the shielding gate 72 is arranged to electrically connect to the source electrode. A bottom of the controlling gate 73 is deeper than a bottom of the first doped region 40. In a further embodiment, a protection region 80 similar to FIG. 4A through FIG. 4B and FIG. 5A through FIG. 5C can also be implemented combining with the split-gate structure of FIG. 8.

In an embodiment, the device is a metal-oxide-semiconductor field effect transistor (MOSFET) comprising a gate terminal, a drain terminal and a source terminal; while in other embodiment, the device is an insulated gate bipolar transistor (IGBT) comprising a gate terminal, a collector terminal and a emitter terminal.

What is claimed is:

1. A silicon carbide semiconductor device, comprising:
   a drift layer, disposed on a SiC substrate, the drift layer having a first conductivity type;
   a first doped region having a second conductivity type, disposed on the drift layer;
   a second doped region having the first conductivity type, disposed on the first doped region;
   a gate trench extending from an upper surface of the second doped region through the first doped region and into the drift layer, the gate trench is formed in a manner dividing the drift layer into a plurality of mesas encircled by the gate trench, each of the mesas comprising a center portion and a plurality of leg portions extended from the center portion;
   a third doped region having the second conductivity type arranged in the center portion of the mesa, disposed in the first doped region and adjacent to the second doped region; and
   a gate electrode arranged in the gate trench and dielectrically insulated from the first doped region, the second doped region and the drift layer by a gate insulator.

2. The silicon carbide semiconductor device according to claim 1, wherein the plurality of leg portions including two or more first leg portions extended from a first side of the center portion and two or more second leg portions extended from a second side of the center portion which is opposite to the first side.

3. The silicon carbide semiconductor device according to claim 1, wherein a protection region having the second conductivity type is further provided below the gate trench along a bottom of the gate trench.

4. The silicon carbide semiconductor device according to claim 3, wherein the protection region is arranged to contact with the first doped region.

5. The silicon carbide semiconductor device according to claim 1, wherein the gate trench comprises a plurality of first trenches along a horizontal direction, a plurality of second trenches along a second horizontal direction orthogonal to the first horizontal direction and a plurality of bulge trenches sandwiched by each of two adjacent leg portions of the mesa.

6. The silicon carbide semiconductor device according to claim 5, wherein a protection region having a second conductivity type is further provided below the gate trench along a bottom of the plurality of bulge trenches.

7. The silicon carbide semiconductor device according to claim 6, wherein the protection region is arranged to contact with the first doped region.

8. The silicon carbide semiconductor device according to claim 6, wherein a protection region having a second conductivity type is further provided below the gate trench along a bottom of the plurality of first trenches, the plurality of second trenches and the plurality of bulge trenches.

9. The silicon carbide semiconductor device according to claim 8, wherein the protection region is arranged to contact with the first doped region.

10. The silicon carbide semiconductor device according to claim 1, wherein for each of the mesas, the plurality of leg portions extended from the center portion along two axes of opposite directions.

11. The silicon carbide semiconductor device according to claim 1, wherein a width of the leg portions is the same as a width of the gate trench.

12. The silicon carbide semiconductor device according to claim 1, wherein a width of the leg portions is smaller than a width of the gate trench.

13. The silicon carbide semiconductor device according to claim 1, wherein a width of the leg portions is smaller than 2 µm, and preferably smaller than 0.5 µm.

14. The silicon carbide semiconductor device according to claim 1, wherein a gate structure is formed in the gate trench and comprises a shielding gate and a controlling gate; a bottom of the controlling gate is lower than a bottom of the first doped region and isolated from the shielding gate by a dielectric insulator; and the shielding gate is arranged to electrically connect to a source terminal, a emitter terminal or a ground potential of the device.

15. The silicon carbide semiconductor device according to claim 1, wherein the device is a metal-oxide-semiconductor field effect transistor (MOSFET) or an insulated gate bipolar transistor (IGBT).

* * * * *